United States Patent [19]

Weischedel et al.

[11] 4,132,947
[45] Jan. 2, 1979

[54] WAVESHAPE DETECTOR

[75] Inventors: Richard C. Weischedel, Camillus, N.Y.; Gerald Carp, Potomac, Md.

[73] Assignee: General Electric Company, Syracuse, N.Y.

[21] Appl. No.: 667,622

[22] Filed: Sep. 6, 1967

[51] Int. Cl.² ................ G01R 23/16; G01R 27/02
[52] U.S. Cl. ............................. 324/77 A; 328/114
[58] Field of Search ............... 324/77 A, 83 Q; 328/114, 132

[56] References Cited

U.S. PATENT DOCUMENTS 3,016,475  1/1962  Kirsten ........................ 324/83 Q Primary Examiner—Theodore M. Blum Attorney, Agent, or Firm—C. W. Baker; R. V. Lang; F. L. Neuhauser

[57] ABSTRACT

Circuitry is described for detecting a waveshape having a change of slope, such as the optical signal wave from a nuclear explosion. The wave is amplitude-sampled at a rate determined by a variable frequency clock pulse generator. Signal pulses indicative of the slope of the wave are generated from the amplitude samples, and a certain number of the most recently generated slope signals are stored in a shift register. Majority logic circuitry, connected to the shift register, generates an output signal when the majority of the slope signals in the shift register changes from a first slope majority to a second slope majority.

10 Claims, 7 Drawing Figures

INVENTOR:
RICHARD C. WEISCHEDEL,
BY Norman C. Fulmer
HIS ATTORNEY.

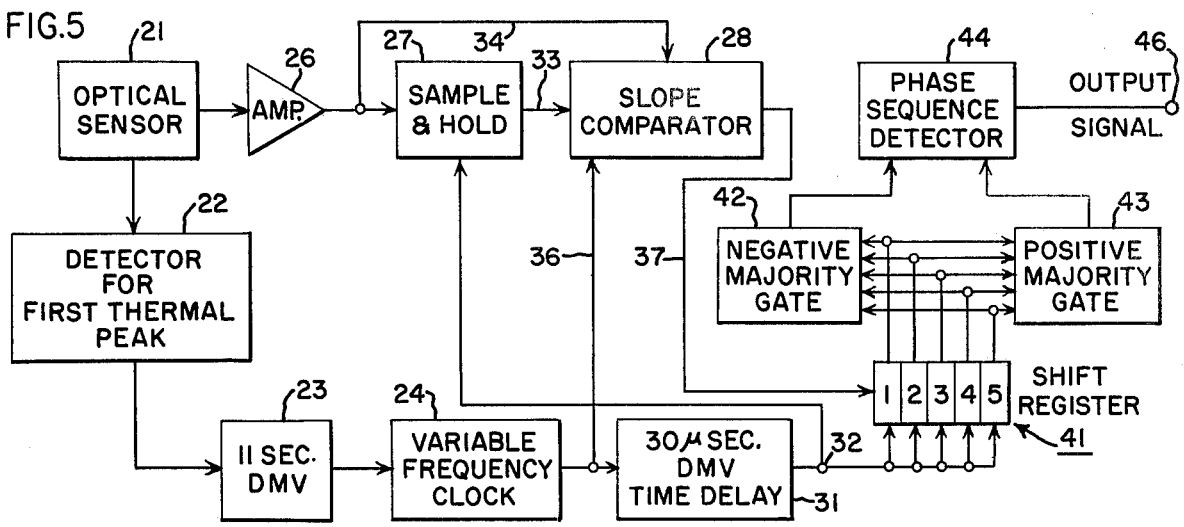
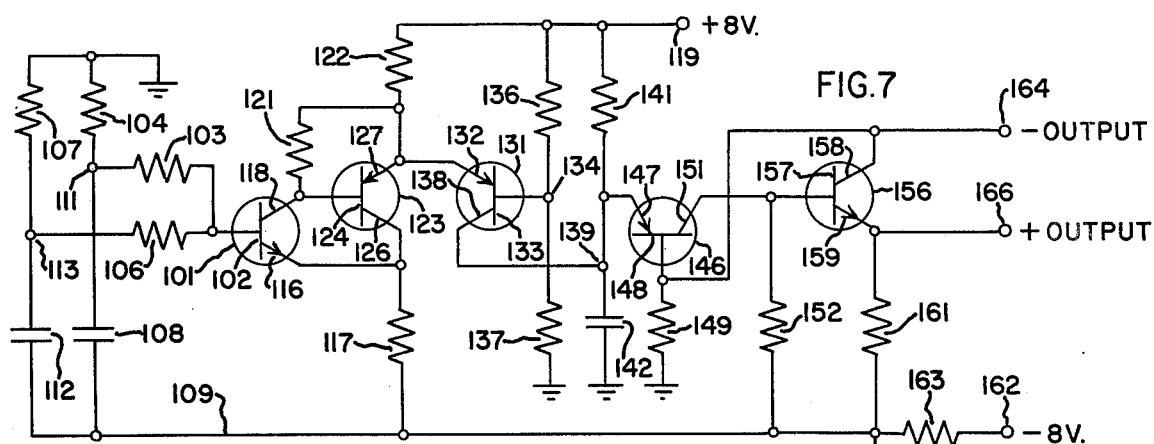
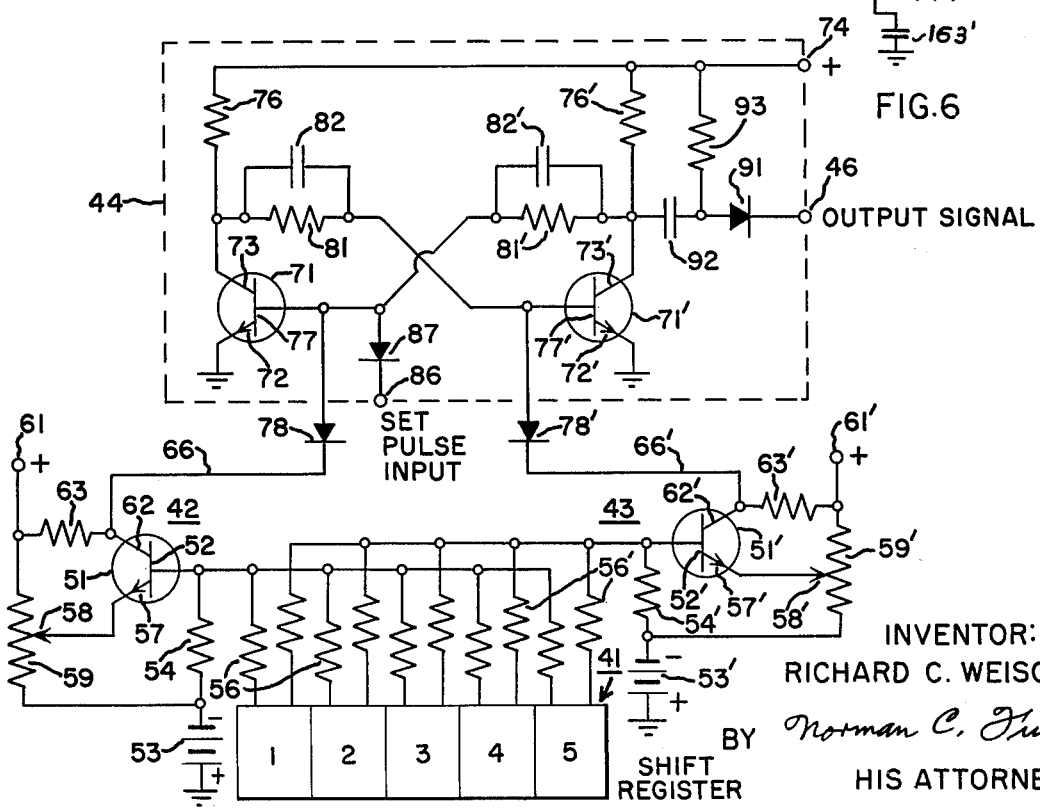

WAVESHAPE DETECTOR

BACKGROUND OF THE INVENTION

Various circuits have been devised for detecting waveshapes by characteristics such as amplitude and the occurrence of a "peak" or "valley" of the wave. One problem frequently encountered with waveshape detectors is the tendency for them to falsely respond to noise signals which often accompany the incoming electrical wave. Another problem is the difficulty in designing a detector suitable for both low-frequency (long time period) and high-frequency (short time period) waves. These problems are particularly severe when high reliability is desired, such as in the case of nuclear explosion detectors which detect any incoming waves (optical radiation, for example) having the characteristic waveshape produced by a nuclear detonation. It is important that such detectors reliably indicate the occurrence of any nuclear explosion so that precautions can be taken against the danger of nuclear fall-out. It is also important that such detectors be immune to giving false responses to other kinds of electrical or optical waves, as this would cause unnecessary activity, and perhaps public panic and lack of confidence in the detection equipment. Furthermore, such detectors for nuclear explosion waves must be capable of detecting a wide range of waves having a "main peak" occurring in a time range from about 33 milliseconds to 10 seconds after the "first peak," as determined by the magnitude of the explosion.

SUMMARY OF THE INVENTION

Objects of the invention are to provide an improved waveshape detector, and to solve the prior-art problems described above.

The improved waveshape detector of the invention comprises, briefly and in a preferred embodiment, means for sampling the amplitude of an incoming wave at intervals of time, means to compare successive amplitude samples and generate pulses indicative of the slope of the wave over increments of time, a shift register connected to store a number of the most recently generated slope pulses, and majority logic circuitry connected to the shift register and adapted to produce an output signal when the majority of the slope pulses in the shift register changes from a first slope majority to a second slope majority. In accordance with a feature of the invention, the majority logic circuitry includes a phase sequence detector, and means to initially set the phase sequence detector in a state whereby it will generate an output signal only after the majority logic passes through the sequence of a first slope majority followed by a second slope majority. In accordance with a further feature of the invention, the sampling means samples the incoming wave at a variable time rate, the sampling commencing at a relatively fast rate and changing to a relatively slower rate, so as to more accurately sample the shapes of incoming waves of differing frequencies or time periods.

BRIEF DESCRIPTION OF THE DRAWING

FIG. 5 is an electrical block diagram of a preferred embodiment of the invention, and FIGS. 6 and 7 are electrical schematic diagrams of certain of the blocks of FIG. 5.

DESCRIPTION OF THE PREFERRED EMBODIMENT

Figure 1:
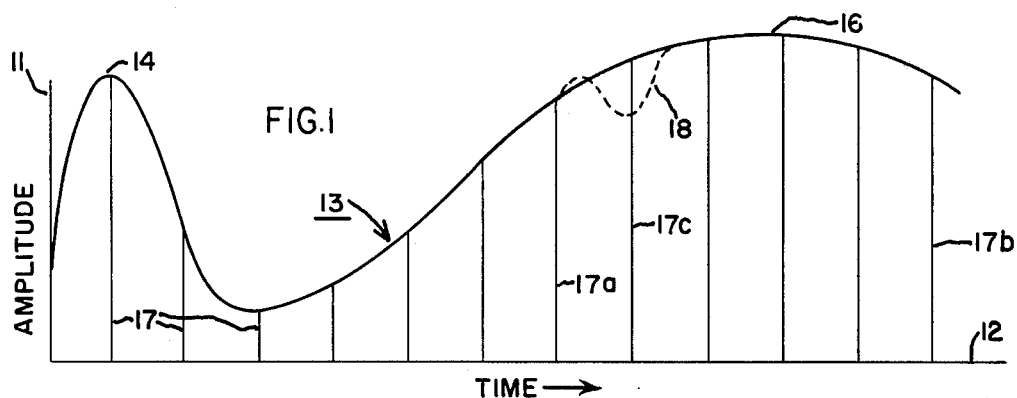
FIGS. 1 and 2 show low-frequency and high-frequency waveshapes, respectively, of nuclear detonation optical signals, sampled at fixed time intervals.

To facilitate understanding the invention, its overall functioning will first be described with reference to the waveshape FIGS. 1 through 4, and then preferred embodiments of circuitry for carrying out the invention will be described. In each of FIGS. 1 through 4, a waveshape is plotted as a function of amplitude represented by the vertial axis 11, versus time represented by the horizontal axis 12. In each figure, an electrical waveshape 13 represents the optical radiation generated by a nuclear detonation, the main characteristics thereof being a first thermal peak 14 and a main thermal peak 16. As will be explained, sampling circuitry samples the amplitude of the wave 13 at times indicated by the vertical lines 17, commencing when the first thermal peak 14 occurs. Successive amplitude samples are compared and pulses are generated which are indicative of whether the wave has a positive or negative slope in the intervals between the amplitude samples. In the preferred embodiment of the invention, a majority logic circuit determines when there have been four successive positive slopes out of five sampling periods. Thus, when the fourth successive positive slope interval has occurred, at the time of the amplitude sampling 17a, the circuitry establishes that the wave is indeed moving in a positive direction. Furthermore, a majority logic circuit subsequently determines when there have been two successive negative slopes of the wave, as at the time of amplitude sample 17b, thus establishing that the main peak 16 has occurred.

Numerous unavoidable noise signals, such as indicated by the dashed line 18 in FIG. 1, accompany the incoming wave. These noise signals are caused by various sources, such as electrical noise within the circuitry, or interfering optical radiations such as can be caused by automobile headlights, moving tree branches causing flickering shadows, etc. In the case of the noise signal 18, the slope sampling period terminated by amplitude sample 17c would falsely indicate a negative slope and hence would falsely indicate a received nuclear wave, if conventional differentiation peak detection circuitry were employed. However, since the invention requires at least two successive samplings of negative slope in order to positively establish the occurrence of the main peak of a nuclear wave, the equipment of the invention is relatively immune from false actuation by noise signals. The foregoing example of noise immunity also applies with respect to the majority logic technique for detecting the positive slope of the wave. Thus, as will be explained more fully, the invention achieves improved noise immunity against the many types of interfering noise signals which accompany the incoming wave 13. The noise immunity is further improved by circuitry which requires indication of a positive slope majority prior to indication of a negative slope majority. The terms positive and negative are used in a comparative sense, and may be reversed — i.e. the waveshapes shown may be inverted, and the detection circuitry suitably altered as to electrical polarity. Preferably, a zero slope is treated as a negative slope. Also, the term "majority logic" is used in a technical sense and may include a "majority" of two out of five, for example.

Figure 2:
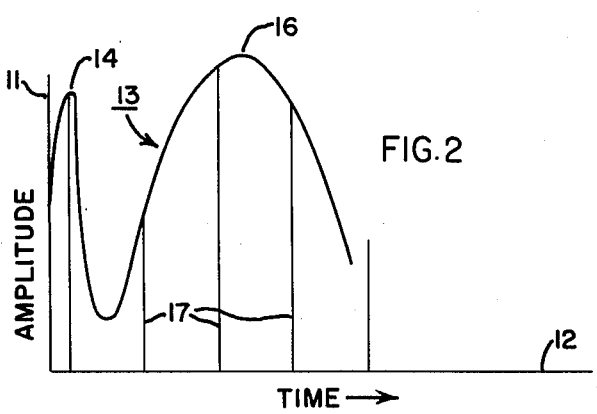

FIG. 2 shows a wave of shorter duration (higher frequency) than shown in FIG. 1, which is indicative of a different magnitude of nuclear detonation. It will be apparent that the time interval of samplings 17, which was suitable for the longer time period wave of FIG. 1, is not suitable for the shorter time period wave of FIG. 2. It is apparent that either the sampling interval should be somehow shortened for detecting a shorter time-period wave such as that of FIG. 2, or else the sampling intervals of both FIG. 1 and FIG. 2 must be shortened in order to detect a variety of signals.

Figure 3:
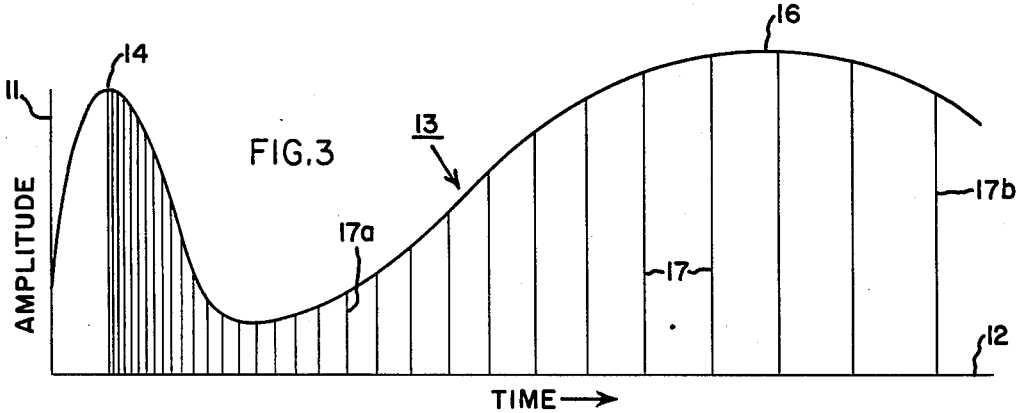
FIGS. 3 and 4 show the same waveshapes as FIGS. 1 and 2, respectively, sampled at varying time intervals in accordance with a feature of the invention.
Figure 4:
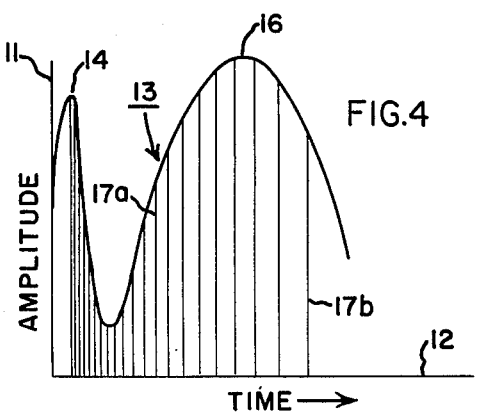

FIGS. 3 and 4 respectively show the same waveshapes 13 as FIGS. 1 and 2, along with a feature of the invention as indicated by the varying-frequency sampling periods 17. As described above with respect to FIG. 1, in each of FIGS. 3 and 4 the circuitry of the invention indicates the occurrence of a positive slope upon the occurrence of a majority of four out of five positive slope intervals, which occurs at sampling point 17a, and determines a subsequent negative slope at sampling point 17b, which is at the end of two successive negative-slope samples. Due to the variable frequency sampling, shown in FIGS. 3 and 4, it will be evident that the invention achieves detection of shorter-time wave forms (FIG. 4) as well as longer-time wave forms (FIG. 3), along with a high degree of noise immunity as described above with respect to FIG. 1.

Now referring to the block diagram of FIG. 5, a preferred embodiment of the invention comprises an optical sensor 21 which preferably comprises a photomultiplier tube, appropriate optical filters and unidirectional lens system, and suitable operating circuitry. An output signal of the optical sensor 21 is applied to a detector 22 for the first thermal peak 14, which may comprise, for example, a high-frequency filter followed by a peak detector. The output signal of the detector 22 is applied to a delayed multivibrator circuit 23 which, when actuated, generates an eleven second timing pulse that is applied to actuate a variable frequency clock circuit 24 which generates the variable timed sampling pulses 17 shown in FIGS. 3 and 4. A detailed schematic diagram of a suitable variable frequency clock 24 is shown in FIG. 7.

A signal output from the optical sensor is amplified by an amplifier 26, and fed to the input of a sample and hold circuit 27 and also to a slope comparator circuit 28.

The sample and hold circuit 27 is actuated by the pulses from the variable frequency clock 24, via a thirty-microsecond time delay circuit 31 and the line 32. The sample and hold circuit 27 comprises, basically, a capacitor which becomes charged to whatever amplitude the incoming signal has at the time of actuation by the delayed clock pulse via line 32. An improved sample and hold circuit particularly suitable for use in the block 27, is described in patent application Ser. No. 483,197, filed Aug. 27, 1965, and assigned to the same assignee as the present patent application. The amplitude sample being held on the capacitor in the circuit 27, appears at the output connection 33 and is applied to an input of the slope comparator 28.

The slope comparator 28 may comprise any suitable voltage comparator circuit, such as one or more diodes or transistors biased by the "held" sample via line 33 and connected to receive each present amplitude sample via line 34 and generate an output signal if the present sample via line 34 is greater than the previous sample via line 33. This comparator circuit is gated, or is followed by a gating circuit or an "AND" circuit, under the control of the clock pulse via line 36, so that the output connection 37 of the slope comparator 28 is fed, for example, a positive pulse whenever the incoming signal 16 has a positive slope and a negative pulse when this signal does not have a positive slope — i.e. when its slope is zero or negative. Immediately following each slope comparison by the slope comparator 28, the sample and hold circuit 27 is caused to sample and hold a new amplitude of the incoming signal 16, by the clock pulse applied thereto via the thirty microsecond time delay 31.

The slope pulses from the slope comparator 28 are applied, via line 37, to the input of a five-stage shift register 41, the shifting of which is controlled by the delayed clock pulses from the output of the time delay circuit 31. Each stage of the shift register 41 is connected to both a negative majority gate 42 and a positive majority gate 43, the outputs of which are connected to a phase sequence detector 44. As will be described in connection with FIG. 6, the negative majority gate 42, positive majority gate 43, and phase sequence detector 44 function to cause an output pulse to be generated at output signal terminal 46, only in the event that there has first been a positive majority of four out of five slope samples, followed by a negative slope "majority" of two out of five samples, thus indicating that the main peak has been reached of the incoming wave 16.

Now referring to FIG. 6, the negative majority gate 42 comprises a transistor 51 having a base electrode 52 connected to a source of bias voltage 53 via a resistor 54, and also connected to each of the five stages of the shift register 41 via individual resistors 56. An emitter 57 is connected to the adjustable path 58 of a potentiometer 59 which is connected between the bias voltage source 53 and a terminal 61 of operating voltage. The collector 62 is connected to the voltage terminal 61 via a load resistor 63. The positive majority gate 43 comprises a circuit identical to that of the negative majority gate 42, the component parts thereof being indicated by primed numerals the same as for the gate 42.

The shift register 41 may comprise, for example, five stages of flip-flop circuits interconnected as shown in FIG. 7.11 on page 190 of the Transistor Manual published by the General Electric Company, seventh edition, 1964, the slope pulse input line 37 being connected to terminal "C" of the first stage, the resistors 56 being connected respectively to either the terminals "A" or "B" of the successive stages, and the resistors 56' being connected to the other terminals "A" or "B" of the shift register stages in the referenced FIG. 7.11, depending on whether the voltage polarities at these lettered terminals are normally positive or negative in the particular flip-flop configurations used. The delayed clock pulses from the variable frequency clock 24 are applied, via line 32, to the shift register 41 in the manner indicated by the "trigger" connection of the referenced FIG. 7.11 in the Transistor Manual.

In the negative majority gate 42, values of the bias voltage 53 and the resistors 54 and polarity of resistors 56, are chosen so that whenever two our of the five stages of the shift register are in a negative state, the transistor 51 is triggered due to the collective effect of voltages applied via resistors 56, and a signal appears at the collector electrode 62 and is applied via line 66 to the phase sequence detector 44. In the positive majority gate 43, the values of bias voltage 53', resistor 54', and the resistors 56', are chosen so that whenever a majority of four out of the five stages of the shift register are in a positive state, the transistor 51' is triggered (due to the collective effect of voltages applied via resistors 56') and a signal appears at the collector 62' which is applied to the line 66' connected to the phase sequence detector 44.

Still referring to FIG. 6, the phase sequence detector 44 preferably comprises a flip-flop circuit having a first transistor 71 and a second transistor 71'. The first transistor 71 has a base 72 electrically grounded, a collector 73 connected to a terminal 74 of operating voltage via a load resistor 76, and a base electrode 77 connected via a diode 78 to the negative majority gate signal line 66. The second transistor 71' is connected similarly to the first transistor 71, the component parts being designated by primed numerals the same as for the first transistor stage 71, the base 77' thereof being connected via a diode 78' to the output line 66' of the positive majority gate 43. The collector 73 of the first transistor is connected via a parallel combination of a resistor 81 and capacitor 82, to the base 77' of the second transistor 71'. Similarly, the collector 73' of the second transistor 71' is connected, via a parallel combination of resistor 81' and capacitor 82', to the base 77 of the first transistor 71. A set pulse input terminal 86 is connected via a diode 87 to the base 77 of the first transistor 71. Means (not shown) are provided to apply a set pulse to the terminal 86 prior to each use of the equipment, to set the phase sequence detector 44 flip-flop in its negative state. Alternatively, circuitry connected to the output of the first peak detector 22 (FIG. 5) may be employed to automatically apply a set pulse to the terminal 86 whenever a first thermal peak is detected.

The output signal terminal 46 is connected, via a diode 91 and capacitor 92, to the collector 73' of the second flip-flop transistor 71'. A resistor 93 is connected between the voltage terminal 74 and junction of the diode 91 and capacitor 92.

Since the phase sequence detector 44 is initially set to the negative condition by the set pulse input at terminal 86, no output signal will be produced at output terminal 46, until there has been a two-step sequence of a positive majority of four out of five in the shift register 41 (which, via a signal on line 66', sets the phase sequence detector 44 from a negative state to a positive state; however, due to the output diode 91, no signal appears at output terminal 46) followed, in turn, by a negative majority of two out of five in the shift register 41, which, due to a negative majority signal on line 66, causes the phase sequence detector 44 to be set to the negative state, whereby an output pulse is generated at output terminal 46 thereby indicating the occurrence of the main peak of the incoming wave.

A preferred circuit for the variable frequency clock 24 will now be described, with reference to FIG. 7. A first transistor 101 has a base electrode 102 connected to electrical ground via a pair of series connected resistors 103 and 104, which resistors are paralleled by another pair of series connected resistors 106 and 107. A capacitor 108 is connected between a line 109 and the junction 111 of the resistors 103 and 104, and another capacitor 112 is connected between the line 109 and the junction 113 of the resistors 106 and 107. The emitter 116 of transistor 101 is connected to the line 109 via a resistor 117, and the collector 118 thereof is connected to a terminal 119 of positive voltage via a pair of series connected resistors 121 and 122. A second transistor 123 has a base 124 connected to the collector 118 of first transistor 101, a collector 126 connected to the emitter 116 of the first transistor 101, and an emitter 127 connected to the junction of the resistors 121 and 122. A third transistor 131 has an emitter 132 connected to the emitter 127 of the second transistor, a base 133 connected to the junction 134 of a pair of series connected resistors 136 and 137 which are connected between the voltage terminal 119 and electrical ground, and a collector 138 connected to the junction 139 of a resistor 141 and capacitor 142 connected in series between the voltage terminal 119 and electrical ground, as shown. A fourth transistor 146 has an emitter 147 connected to the junction 139, a base 148 connected to ground via a resistor 149, and a collector 151 connected to the line 109 via a resistor 152. A fifth transistor 156 has a base 157 connected to the collector 151 of the fourth transistor; a collector 158 connected to the base 148 of the fourth transistor; and an emitter 159 connected to the line 109 via a resistor 161. A terminal of negative operating voltage 162 is connected to the line 109 via a resistor 163. A negative signal output terminal 164 is connected to the collector 158, and a positive signal output terminal 166 is connected to the emitter 159.

The functioning of the variable frequency clock 24 will now be described, with reference to FIG. 7. The clock 24 is turned on by application of a positive voltage (with respect to ground) to the terminal 119 and a negative voltage (with respect to ground) to the voltage terminal 162. These voltages may be applied from voltage sources, via switches actuated for eleven seconds by the output of the delayed multivibrator 23. Upon application of these voltages, the capacitor 108 commences to charge from the voltage at line 109, via resistor 104. Simultaneously, the capacitor 112 commences to charge from the voltage at line 109, via resistor 107. The resistor 163, in combination with capacitor 163', serves as a filter to uncouple line 109 from the power supply. The resistors 103 and 106 apply a voltage, derived from the points 111 and 113, to the base electrode 102 of the first transistor 101. Thus, a "voltage ramp" is applied to the base 106, the shape thereof being determined by the time constants of the two series charging circuits 108, 104 and 112, 107. These values are chosen, preferably, so that the voltage ramp at base 102 will have a more gradual slope than the exponential curve that would occur if only a single capacitor charging circuit were employed.

The first transistor 101 functions as an emitter follower, applying the voltage ramp to the second transistor 123 which functions as a variable impedance as will be described. While the capacitors 108 and 112 are charging as has been described, the capacitor 142 is also charging, from voltage at the positive voltage terminal 119, via the resistor 141. Also, initially, the capacitor 142 receives charging current via the resistor 122 and the emitter-collector path 132, 138 of the third transistor 131. This, initially, is the fastest charging rate for the capacitor 142. The second transistor 123 is initially non-conductive through its emitter-collection path 127, 126. However, as the aforesaid voltage ramp builds up at the base 102 of the first transistor 101, the second transistor 123 is gradually rendered more and more conductive, so that its emitter-collector path 126, 127 draws an increasing current through resistor 122, thus increasingly "robbing" current away from the emitter-collector path 132 - 138 of the third transistor 131 which initially contributed to the charging of capacitor 142. After a time, for example about eleven seconds in the preferred embodiment of the invention, substantially the only charging current for capacitor 142 is that provided through the resistor 141.

The variable charging rate on capacitor 142 controls the frequency of a monostable multivibrator constituted by the fourth and fifth transistors 146 and 156. The transistor 146 is rendered conductive and discharges the capacitor 142, each time the charging voltage on the capacitor 142 reaches a value of voltage, which is applied to the emitter 147, for rendering the transistor 146 conductive. After discharging the capacitor 142, action of the monostable multivibrator renders the transistor 146 again non-conductive, whereupon capacitor 142 again commences to charge. This action occurs repeatedly; however, the rate of charging of capacitor 142, and hence the rate of oscillation of the multivibrator circuit, slows down with time due to the aforesaid action of the voltage ramp at the first transistor 101. Preferably, in the preferred example of the invention, the initial frequency of the variable frequency clock is 330 cycles per second, at the time of occurrence of the first peak 14, and reduces to a frequency of two cycles per second after about 10 seconds which is time of occurrence of the main peak 16 of the incoming wave 13 of the longest duration contemplated. The positive pulse output at terminal 166 or negative pulse output at terminal 164 will be utilized, depending upon the polarity desired for properly actuating the slope comparator 28 and other circuitry controlled from the variable frequency clock 24.

Overall functioning of the preferred embodiment shown in FIG. 5 will now be summarized, the functioning of the various circuits thereof having been described above. When the first peak detector 22 detects a signal having the characteristics of the first peak 14, the variable frequency clock 24 is actuated for a period of 11 seconds, as timed by the 11 second delayed multivibrator 23. The variable frequency clock pulses actuate the sample and hold circuit 27 and slope comparator circuit 28, thereby generating samples of slope of the incoming signal as illustrated by the sampling lines 17 in FIGS. 1 through 4. Slope sample signal pulses are applied via connection 37 to the input of the shift register 41. The shift register 41 is shifted by the clock pulses via the time delay 31, and the time delay 31 also functions to cause the sample and hold circuit 27 to take another sample of the incoming wave immediately after a slope pulse has been generated by the slope comparator 28. The phase sequence detector 44 has been set in the negative slope condition by means of a set pulse input applied to terminal 36 (FIG. 6) as has been described. Whenever the five most recent slope samples, as stored in the shift register 41, have a positive majority of four out of five, the positive majority gate 43 actuates the phase sequence detector 44 to its "positive slope" state (but no signal is produced at output terminal 46), and then, if this is followed by a negative majority of two out of five in the shift register 41, the negative majority gate 42 shifts the phase sequence detector 44 back to the "negative" state, whereupon an output signal is generated at the output terminal 46, indicating the occurrence of a main peak 16 of the incoming wave 13, which, in the example given, indicates the occurrence of a signal of the type produced by a nuclear explosion. This output signal at terminal 46 may be utilized to sound an alarm, or to cooperate with additional signal sensing and testing equipment, to indicate the occurrence of a nuclear explosion.

The magnitude of the nuclear explosion is indicated by the time of occurrence between the first peak 14 and the main peak 16, this time usually being in the range of from 33 milliseconds to 10 seconds. This timing is readily determined by a clock or timer circuit connected to be started by the output signal of the first peak detector 22, and stopped upon occurrence of an output signal at the output terminal 46.

From the above description of a preferred embodiment of the invention, it will be apparent that the invention achieves its objectives of detecting incoming waveshapes accurately, and with improved immunity to noise due to the majority logic employed in connection with the sampling of the slope of the incoming wave, and also can accurately detect a wide range of timing or frequency of input waves, due to the feature of the variable frequency sampling rate. Although the preferred embodiment of the invention employs a positive majority of four out of five and a negative majority of two out of five for accurately determining slopes of the incoming wave, various other majority ratios may be employed, and the same majority ratio may be employed for negative as for positive slope, and if desired a shift register 41 having greater than five stages may be employed in order to insure greater noise immunity; however, a greater number of shift register stages will slow down the response time for producing an output signal indicative of occurrence of the main peak of an incoming wave.

While a preferred embodiment of the invention has been shown and described, various other embodiments and modifications will be apparent to persons skilled in the art, and will fall within the scope of invention as defined by the following claims.

We claim:

1. A waveshape detector having means to repetitively sample the slope of an electrical wave and provide signals indicative of said slope, and means for comparing said slope signals to determine a change in slope of said wave, wherein the improvement comprises storage means for storing at least some of said slope signals and output means connected to said storage means and adapted to determine when a certain number of slope signals indicating a given slope are contained in said storage means.

2. A waveshape detector as claimed in claim 1, in which said storage means comprises a shift register having an input connected to receive said slope signals and comprising a given number of stages for storing a corresponding number of the most recent slope signals, means for causing said shift register to shift at a rate determined by the repetitive sampling rate, and in which said output means includes a logic circuit connected to the stages of said shift register and adapted to determine when a certain number of said stages are in a state indicative of a given slope of said wave.

3. A waveshape detector as claimed in claim 2, including a second logic circuit connected to the stages of said shift register and adapted to determine when a predetermined number of said stages are in a state indicative of a different slope of said wave, and a phase sequence detector connected to said first and second logic circuits and adapted to determine the occurrence of a predetermined sequence of said slope determinations by said logic circuits.

4. A waveshape detector as claimed in claim 3, in which said certain number of stages is a different number than said predetermined number of stages.

5. A waveshape detector as claimed in claim 3, including means for causing said repetitive sampling means to have a varying sampling rate which varies with respect to time from a relatively faster rate to a relatively slower rate.

6. A waveshape detector as claimed in claim 1, including means for causing said repetitive sampling means to have a varying sampling rate which varies with respect to time from a relatively faster rate to a relatively slower rate.

7. A waveshape detector having means to repetitively sample the slope of an electrical wave and provide signals indicative of said slope, and means for comparing said slope signals to determine a change in slope of said wave, wherein the improvement comprises means for causing said repetitive sampling means to have a variable sampling rate which varies with respect to time from a relatively faster rate to a relatively slower rate.

8. A waveshape detector for nuclear detonation waveshapes which have the characteristic of a first peak followed by a main peak, wherein the improvement comprises detector means for detecting the occurrence of said first peak, a clock pulse circuit connected to generate clock pulses upon detection of a first peak by said detector means, means controlled by said clock pulses for repetitively sampling said waveshape and providing signals indicative of the slope of said waveshape, a plural-stage shift register means connected to be shifted under the control of said clock pulses and also connected to receive said signals indicative of slope, and output means including a logic circuit connected to the stages of said shift register and adapted to determine when a certain number of said stages are in a state indicative of a given slope of said waveshape.

9. A waveshape detector as claimed in claim 8, in which said output means includes a second logic circuit connected to said stages of the shift register and adapted to determine when a predetermined number of said stages are in a state indicative of a different slope of said waveshape, and a phase sequence detector connected to said first and second logic circuits and adapted to determine the sequential occurrence of a predetermined sequence of said slope determinations by said logic circuits.

10. A waveshape detector as claimed in claim 8, including means for causing said clock pulse circuit to generate clock pulses at a varying time rate which varies with respect to time from a relatively faster rate to a relatively slower rate.

* * * * *